US008421939B2

(12) United States Patent
Kaigawa

(10) Patent No.: US 8,421,939 B2
(45) Date of Patent: Apr. 16, 2013

(54) DISPLAY CONTROL SUBSTRATE, MANUFACTURING METHOD THEREOF, LIQUID CRYSTAL DISPLAY PANEL, ELECTRONIC INFORMATION DEVICE

(75) Inventor: Hiroyuki Kaigawa, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1644 days.

(21) Appl. No.: 11/721,926

(22) PCT Filed: Dec. 15, 2005

(86) PCT No.: PCT/JP2005/023084
§ 371 (c)(1),
(2), (4) Date: Aug. 15, 2007

(87) PCT Pub. No.: WO2006/064887
PCT Pub. Date: Jun. 22, 2006

(65) Prior Publication Data
US 2009/0303214 A1      Dec. 10, 2009

(30) Foreign Application Priority Data

Dec. 17, 2004   (JP) ................................ 2004-366906

(51) Int. Cl.
*G02F 1/136*   (2006.01)
*G02F 1/1343*  (2006.01)

(52) U.S. Cl.
USPC .............................. 349/43; 349/39; 349/139

(58) Field of Classification Search .................... 349/38, 349/39, 43, 139, 143
See application file for complete search history.

(56) References Cited

U.S. PATENT DOCUMENTS

| 4,938,567 A | 7/1990 | Chartier |
| 6,633,359 B1 | 10/2003 | Zhang et al. |
| 7,612,753 B2 * | 11/2009 | Koyama ........................ 345/100 |
| 2004/0036816 A1 * | 2/2004 | Yun ................................. 349/43 |

FOREIGN PATENT DOCUMENTS

| JP | 1-501100 A | 4/1989 |
| JP | 03-249735 A | 11/1991 |
| JP | 04-280231 A | 10/1992 |
| JP | 04-338730 A | 11/1992 |
| JP | 08-139335 A | 5/1996 |
| JP | 10-048651 A | 2/1998 |

(Continued)

OTHER PUBLICATIONS

Official Communication for PCT Application No. PCT/JP2005/023084; mailed on Mar. 14, 2006.

*Primary Examiner* — Edward Glick
*Assistant Examiner* — David Chung
(74) *Attorney, Agent, or Firm* — Keating & Bennett, LLP

(57) ABSTRACT

A display control substrate and a method of manufacturing thereof, includes a thin film transistor (TFT) that is provided for each of a multiplicity of pixel sections provided in two dimensions and is an inversely staggered TFT. A gate electrode wiring, a Cs wiring and a source electrode wiring of the TFT are simultaneously formed. An interlayer insulation film is deposited after gate insulation films and semiconductor islands are formed. After contact holes are formed in the interlayer insulation film, at the time of forming a pixel electrode, a connecting portion for connecting cut portions of the source electrode wirings via the contact hole is formed. The source electrode wiring is connected to a source region of the semiconductor island by the connecting portion. This process reduces the number of masks required at the time of manufacturing a TFT substrate, and also reduces the lead time, increases the yield and reduces the manufacturing cost.

3 Claims, 9 Drawing Sheets

FOREIGN PATENT DOCUMENTS

| | | |
|---|---|---|
| JP | 2001-051303 A | 2/2001 |
| JP | 2002-184992 A | 6/2002 |
| JP | 2002-185002 A | 6/2002 |
| JP | 2002-190602 A | 7/2002 |
| JP | 2003-077933 A | 3/2003 |
| WO | 88/02872 A1 | 4/1988 |

* cited by examiner

Fig.4
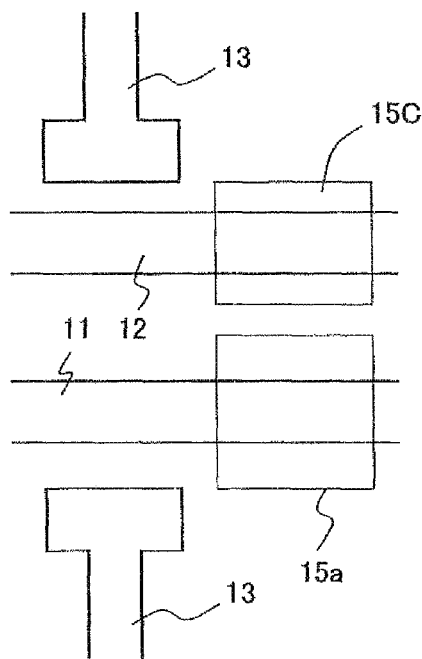
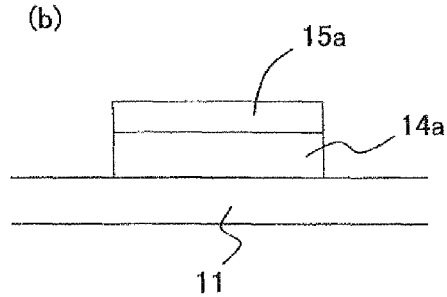
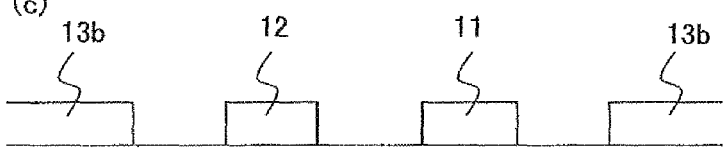
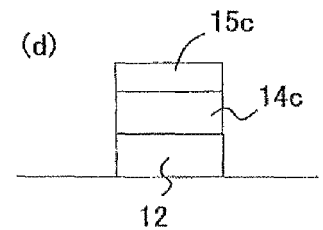

Fig.7
(a)
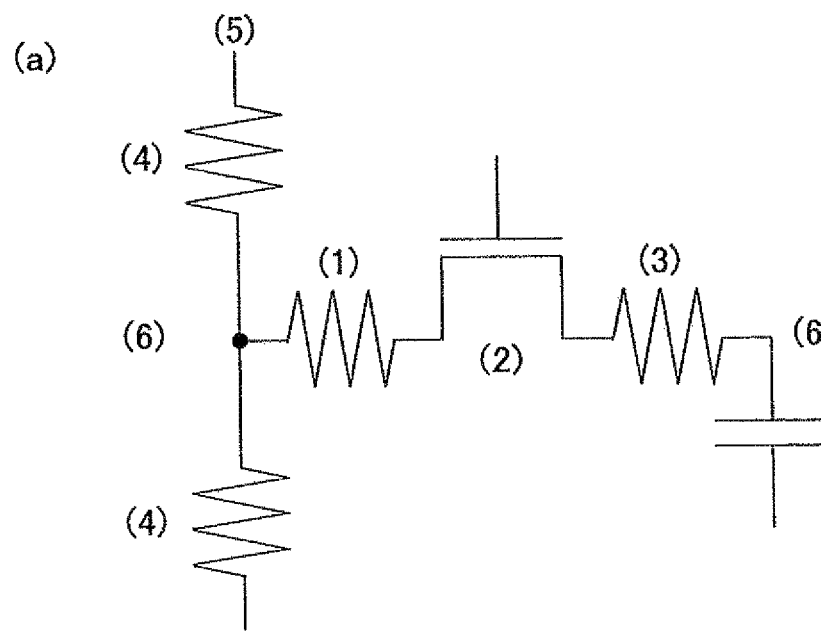
10
(b)
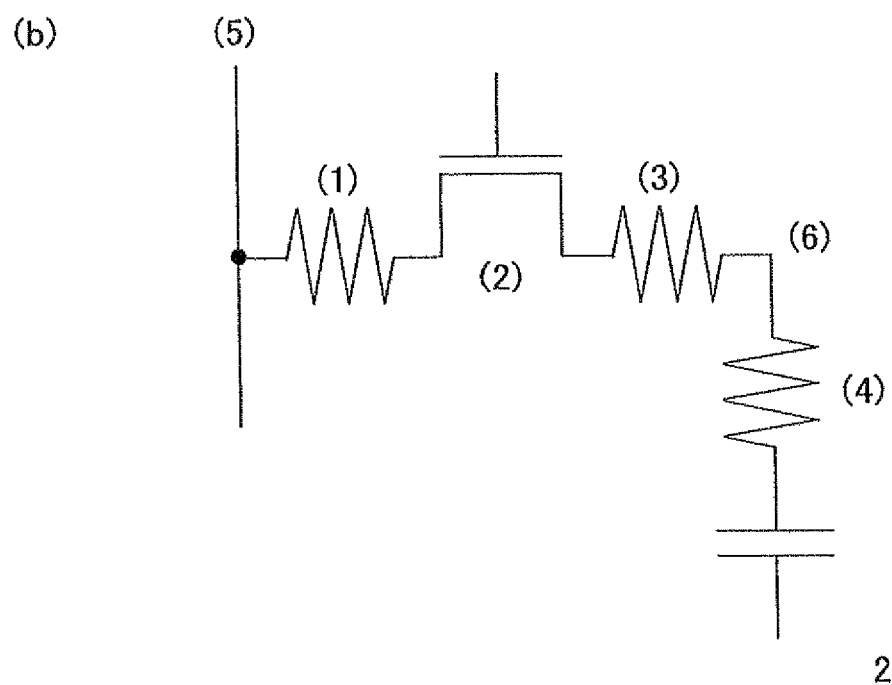
20

DISPLAY CONTROL SUBSTRATE, MANUFACTURING METHOD THEREOF, LIQUID CRYSTAL DISPLAY PANEL, ELECTRONIC INFORMATION DEVICE

BACKGROUND OF THE INVENTION

1. Field of the Invention

The present invention relates to: a display control substrate, such as a thin film transistor (thin film transistor) substrate, in which a TFT or the like is provided as a transistor element, for each of a multiplicity of pixel sections provided in two dimensions, used in an active matrix-type liquid crystal display device and the like, for example; a method for manufacturing the display control substrate; a liquid crystal display panel using the display control substrate; and an electronic information device using the display control substrate in the liquid crystal display panel, such as a television device, a monitoring device, a personal computer (e.g., laptop personal computer), an amusement electronic device and a game device.

2. Description of the Related Art

Conventionally, in the active matrix-type liquid crystal display device, the TFT is used as a switching element for each of a plurality of pixel sections provided in a matrix in a display section and as a semiconductor element making up a drive circuit section provided at the periphery of the display section.

Wirings of the TFT includes a gate electrode wiring, a source electrode wiring, a drain electrode wiring and the like. In a conventional method for manufacturing a TFT substrate, the gate electrode wiring and the source electrode wiring are formed in separate mask steps since the gate electrode wiring and the source electrode wiring intersect each other, and thus two layers of masks are required. As a result, in order to complete the TFT, for example, in the case of an inversely staggered TFT, five layers of masks are required in order to form a gate electrode wiring, a semiconductor island, source/drain electrode wirings, a contact hole in an interlayer insulation film and a transparent electrode. This is a cause of increasing the lead time, reducing the yield, increasing the manufacturing cost and the like.

FIG. 8 is a top view showing an exemplary essential structure of a TFT substrate used as a switching element for a pixel section of a conventional active matrix-type liquid crystal display device. Herein, an inversely staggered TFT will be described as an example.

In FIG. 8, on a TFT substrate 20, gate electrode wirings 21 and compensation capacitance (Cs) wirings 22 are repeatedly provided in parallel to each other. A semiconductor island 23a is provided on the gate electrode wiring 21 via a gate insulation film (not shown). The semiconductor island 23a is made of an intrinsic semiconductor layer, which becomes a channel region of the TFT, and an impurity-doped semiconductor layer (e.g., n+ semiconductor layer). On the compensation capacitance wiring 22, a semiconductor island 23b which becomes a part of a compensation capacitance upper electrode is provided via a compensation capacitance insulation film (not shown). The gate insulation film and the compensation capacitance insulation film are made of the same insulation film material and they are provided so as to cover the substrate. On top thereof, a source electrode wiring 24 is provided via the insulation films so as to intersect the gate electrode wiring 21 and the compensation capacitance wiring 22.

The source electrode wiring 24 is formed so as to have a portion extending over to the semiconductor island 23a. An extension portion 24a of the source electrode wiring 24 is electrically connected to the semiconductor island 23a. In addition, a drain electrode wiring 24b is provided so as to extend from the semiconductor island 23a to a semiconductor island 23b. The drain electrode wiring 24b is electrically connected to the semiconductor island 23a and the semiconductor island (a part of the compensation capacitance upper electrode) 23b. A transparent electrode 25 is provided at least over the semiconductor island 23b via an interlayer insulation film (not shown). The transparent electrode 25 is electrically connected to the drain electrode wiring 24b via a contact hole 26 which is provided in the interlayer insulation film. In a pixel section, the transparent electrode 25 is provided in a quadrangular pixel region surrounded by the gate electrodes wiring 21 and the source electrode wirings 24, and it is used as a pixel electrode.

Hereinafter, a conventional method for manufacturing the TFT substrate 20 will be described in detail with reference to Portion (a) of FIG. 9 to Portion (e) of FIG. 9.

Portion (a) of FIG. 9 to Portion (e) of FIG. 9 are top views showing an exemplary essential structure for describing each step of manufacturing the TFT substrate 20 in FIG. 8.

First, as shown in Portion (a) of FIG. 9, a step of forming the gate electrode wiring 21 and the compensation capacitance wiring 22 is performed. In this step, a glass substrate which becomes the TFT substrate 20 is cleaned by a WET cleaning or a DRY cleaning. Thereon, a metal material which becomes the gate electrode wiring 21 and the compensation capacitance (Cs) wiring 22 is deposited by a sputtering method or a CVD method. A resist mask is formed by a photolithography, and an etching is performed thereon by a WET etching or a DRY etching. As shown in Portion (a) of FIG. 9, the gate electrode wiring 21 and the compensation capacitance wiring 22 which are parallel to each other are formed, and the resist mask is removed by the WET method or the DRY method.

Next, as shown in Portion (b) of FIG. 9, a step of depositing the insulation film material and forming the semiconductor islands 23a and 23b is performed. In this step, the insulation film material which becomes the gate insulation film and the compensation capacitance insulation film, and the intrinsic semiconductor layer which becomes the channel region of the TFT and the part of the compensation capacitance upper electrode are deposited by the CVD method so as to form the impurity-doped semiconductor layer. A resist mask is formed by the photolithography, and an etching is performed thereon by the WET etching or the DRY etching. As shown in Portion (b) of FIG. 9, the semiconductor islands 23a and 23b are formed on the gate electrode wiring 21 and the compensation capacitance wiring 22 via the insulation films. The resist mask is removed by the WET method or the DRY method. In this case, in order to maintain the insulation between the source/drain electrode wirings which is to be formed later, and the gate electrode wiring, the insulation films with a thickness of about 500 nm deposited by the CVD method remains.

Further, as shown in Portion (c) of FIG. 9, a step of forming the source electrode wiring 24, the extension portion 24a and the drain electrode wiring 24b is performed. In this step, on the substrate where the insulation films and the semiconductor islands 23a and 23b are formed, a metal layer is deposited by the sputtering method or the CVD method. A resist mask is formed by the photolithography. An etching is performed thereon by the WET etching method or the DRY etching method so as to form, as shown in Portion (c) of FIG. 9, the extension portion 24a which is parallel to the gate electrode wiring 21 and the compensation capacitance wiring 22 and which extends onto the semiconductor island 23a, and the source electrode wiring 24 which is connected to the extension portion 24a, and the drain electrode wiring 24b which extends from the semiconductor island 23a to the semiconductor island 23b is formed. The resist mask is removed by the WET method or the DRY method.

Thereafter, as shown in Portion (d) of FIG. 9, a step of depositing the interlayer insulation film and forming the contact hole 26 is performed. In this step, the interlayer insulation film is deposited by the CVD method or the like on the substrate, as shown in Portion (c) of FIG. 9, where the source electrode wiring 24 and the extension portion 24a thereof and the drain electrode wiring 24b are formed, in order to electrically insulate between the source electrode wiring 24, the extension portion 24a thereof and the drain electrode wiring 24b, and the transparent electrode 25, which is to be formed later. In order to connect to the transparent electrode 25, which is to be formed later, a resist mask is formed on the interlayer insulation film by the photolithography method, an etching is performed thereon by the WET etching method or the DRY etching method, and as shown in Portion (d) of FIG. 9, the contact hole 26 is formed in the interlayer insulation film on the drain electrode wiring 24b overlying the semiconductor island 23b. The resist mask on the interlayer insulation film is removed by the WET method or the DRY method.

Lastly, as shown in Portion (e) of FIG. 9, a step of forming the transparent electrode is performed. In this step, a transparent electrode material is deposited on the interlayer insulation film and the contact hole 26 by the sputtering method or the CVD method. A resist mask is formed by the photolithography, and an etching is performed thereon by the WET etching method or the DRY etching method. As shown in Portion (e) of FIG. 9, the transparent electrode 25 is formed for each region surrounded by the gate electrode wirings 21 and the source electrode wirings 24. The resist mask is removed by the WET method or the DRY method.

The TFT substrate 20 manufactured in this manner is arranged opposite to a counter substrate having a counter electrode arranged thereon with a predetermined gap there between. The surrounding thereof is bonded. A liquid crystal material is implanted from an implantation opening into the gap between the substrates and the implantation opening is sealed. As such, a liquid crystal panel is formed.

As described above, in the conventional method for manufacturing the TFT, for example, in the case of the inversely staggered TFT, the fiver layers of masks are required in order to form the gate electrode wiring 21, the semiconductor islands 23a and 23b, the source/drain electrode wirings 24, 24a and 24b, the contact hole 26 and the transparent electrode 25. This is a cause of increasing the lead time, reducing the yield and increasing the manufacturing cost.

In addition, Reference 1 discloses, for example, a method for manufacturing a normally staggered TFT in which steps for the manufacturing are simplified and the TFT has excellent electric properties both in a drive circuit section and a pixel section. In the conventional technique disclosed in Reference 1, a resistance value is adjusted with an ion implantation, and six layers of masks of an LDD region mask, a drive circuit region LDD region mask, a channel region mask and the like are required.

[Reference 1] Japanese Laid-Open Publication No. 08-139335

SUMMARY OF THE INVENTION

As the wirings of the conventional TFT described above, there are the gate electrode wiring, the source electrode wiring and the drain electrode wiring. In the conventional method for manufacturing the TFT, each wiring is formed in a different mask step. Thus, two layers of masks are required. This is a cause of increasing the lead time, reducing the yield and increasing the manufacturing cost.

The present invention is intended to solve the problems described above. The objective of the present invention is to provide a display control substrate, in which the number of masks can be reduced, thus realizing the reduction of the lead time, the increase of the yield and the reduction of the manufacturing cost; a method for manufacturing the display control substrate; a liquid crystal display panel using the display control substrate; and an electronic information device using the display control substrate in the liquid crystal display panel, such as a television device, a monitoring device, a personal computer (e.g., laptop personal computer), an amusement electronic device and a game device.

A method for manufacturing a display control substrate according to the present invention is provided, in which a gate of a transistor element is connected to a gate electrode wiring and a source electrode wiring is connected to a pixel electrode via the transistor element, the method including: a wiring forming step of forming the gate electrode wiring and the source electrode wiring in directions so as to intersect each other while one of the gate electrode wiring and the source electrode wiring is cutoff at cut portions such that the other passes between the cut portions; a contact hole forming step of forming an interlayer insulation film on a substrate after the wiring forming step and forming contact holes in the interlayer insulation film so as to reach the respective cut portions; and at the time of forming the pixel electrode by processing a pixel electrode material deposited on the substrate after the contact hole forming step, a step of forming a connecting portion for connecting both cut portions via the respective contact holes, thereby the objective described above being achieved.

Preferably, the wiring forming step in a method for manufacturing a display control substrate according to the present invention forms the gate electrode wiring and a compensation capacitance wiring parallel to the gate electrode wiring, and the source electrode wiring in directions so as to intersect each other while one of the gate electrode wiring and the compensation capacitance wiring, and the source electrode wiring is cutoff at cut portions such that the other passes between the cut portions.

Still preferably, the wiring forming step in a method for manufacturing a display control substrate according to the present invention forms the source electrode wiring and a compensation capacitance wiring parallel to the source electrode wiring, and the gate electrode wiring in directions so as to intersect each other while one of the source electrode wiring and the compensation capacitance wiring, and the gate electrode wiring is cutoff at cut portions such that the other passes between the cut portions.

A method for manufacturing a display control substrate according to the present invention is provided, in which a gate of a transistor element is connected to a gate electrode wiring and a source electrode wiring is connected to a pixel electrode via the transistor element, the method including: a wiring forming step of depositing a metal layer on a substrate and processing the metal layer so as to form the gate electrode wiring, and the source electrode wiring in a direction intersecting the gate electrode wiring and cutoff by a formed portion of the gate electrode wiring; a semiconductor region forming step depositing an insulation film material and a semiconductor material on the substrate in this order after the wiring forming step and processing the insulation film material and the semiconductor material so as to form a semiconductor region on the gate via a gate insulation film, wherein the insulation film material becomes the gate insulation film and the semiconductor material becomes the semiconductor region of the transistor element; a contact hole forming step of depositing an interlayer insulation film on the substrate after the semiconductor region forming step and forming contact holes in the interlayer insulation film so as to reach a source region and a drain region of the semiconductor region and the cut portions of the source electrode wirings, respectively; and a pixel electrode material forming step of depositing a pixel electrode material on the substrate after the contact hole forming step and processing the pixel electrode material so as to form a connecting portion for connecting both cut portions of the source electrode wirings and for connecting to the source region and to form a pixel electrode for connecting to the drain region via the respective contact holes, thereby the objective described above being achieved.

A method for manufacturing a display control substrate according to the present invention is provided, in which a gate of a transistor element is connected to a gate electrode wiring and a source electrode wiring is connected to a pixel electrode via the transistor element, the method including: a semiconductor region forming step of depositing a semiconductor material on a substrate and processing the semiconductor material so as to form a semiconductor region of the transistor element; a wiring forming step of depositing an insulation film material and a metal layer on the substrate in this order after the semiconductor region forming step and processing the metal layer so as to form the gate electrode wiring and the source electrode wiring in a direction so as to intersect the gate electrode wiring and cutoff by a formed portion of the gate electrode wiring and to form the gate electrode on the semiconductor region via a gate insulation film, wherein the insulation film material becomes the gate insulation film; a contact hole forming step of depositing an interlayer insulation film on the substrate after the wiring forming step and forming contact holes in the interlayer insulation film and the insulation film material so as to reach a source region and a drain region of the semiconductor region and cut portions of the source electrode wirings, respectively; and a pixel electrode material forming step of depositing a pixel electrode material on the substrate after the contact hole forming step and processing the pixel electrode material so as to form a connecting portion for connecting both cut portions of the source electrode wirings and for connecting to the source region and to form a pixel electrode for connecting to the drain region via the respective contact holes, thereby the objective described above being achieved.

A method for manufacturing a display control substrate according to the present invention is provided, in which a plurality of gate electrode wirings and a plurality of compensation capacitance wirings parallel to each other, and a plurality of source electrode wirings are arranged in directions so as to intersect each other, a gate electrode is connected to the gate electrode wiring in a vicinity of a wiring intersecting portion for each pixel region surrounded by the gate electrode wirings and the source electrode wirings, a transistor element having a source region thereof connected to the source electrode wiring in the vicinity of the wiring intersecting portion, a pixel electrode connected to a drain region of the transistor element and a compensation capacitance connected between the drain region and the compensation capacitance wiring are arranged, the method including: a wiring forming step of depositing a metal layer on a substrate and processing the metal layer so as to form the gate electrode wiring and a compensation capacitance wiring parallel to the gate electrode wiring, and the source electrode wiring in a direction so as to intersect the gate electrode wiring and the compensation capacitance wiring and cutoff by formed portions of the gate electrode wiring and the compensation capacitance wiring; a semiconductor region forming step of depositing an insulation film material and a semiconductor material on the substrate in this order after the wiring forming step and processing the insulation film material and the semiconductor material so as to form a semiconductor region on the gate electrode via a gate insulation film and to form a semiconductor region as an upper electrode of the compensation capacitance on the compensation capacitance wiring via a compensation capacitance insulation film, wherein the insulation film material becomes the gate insulation film and the compensation capacitance insulation film and the semiconductor material becomes the semiconductor region of the transistor element and the upper electrode of the compensation capacitance; a contact hole forming step of depositing an interlayer insulation film on the substrate after the semiconductor region forming step and forming contact holes in the interlayer insulation film so as to reach the source region and the drain region of the semiconductor region, the upper electrode of the compensation capacitance and the cut portions of the source electrode wirings, respectively; and a pixel electrode material forming step of depositing a pixel electrode material on the substrate after the contact hole forming step and processing the pixel electrode material so as to form a connecting portion for connecting both cut portions of the source electrode wirings and for connecting to the source region and to form a pixel electrode for connecting to the drain region and for connecting to the upper electrode of the compensation capacitance via the respective contact holes, thereby the objective described above being achieved.

A method for manufacturing a display control substrate according to the present invention is provided, in which a plurality of gate electrode wirings and a plurality of compensation capacitance wirings parallel to each other, and a plurality of source electrode wirings are arranged in directions so as to intersect each other, a gate electrode is connected to the gate electrode wiring in a vicinity of a wiring intersecting portion for each pixel region surrounded by the gate electrode wirings and the source electrode wirings, a transistor element having a source region thereof connected to the source electrode wiring in the vicinity of the wiring intersecting portion, a pixel electrode connected to a drain region of the transistor element and a compensation capacitance connected between the drain region and the compensation capacitance wiring are arranged, the method including: a wiring forming step of depositing a metal layer on a substrate and processing the metal layer so as to form the source electrode wiring, the gate electrode wiring in a direction so as to intersect the source electrode wiring and cutoff by a formed portion of the source electrode wiring, and the compensation capacitance wiring parallel to the gate electrode wiring and cutoff by a formed portion of the source electrode wiring; a semiconductor region forming step of depositing an insulation film material and a semiconductor material on the substrate in this order after the wiring forming step and processing the insulation film material and the semiconductor material so as to form a semiconductor region of the transistor element on the gate electrode via a gate insulation film and to form a semiconductor region as an upper electrode of the compensation capacitance on the compensation capacitance wiring via a compensation capacitance insulation film, wherein the insulation film material becomes the gate insulation film and the compensation capacitance insulation film and the semiconductor material becomes the semiconductor region of the transistor element and the upper electrode of the compensation capacitance; a contact hole forming step of depositing an interlayer insulation film on the substrate after the semiconductor region forming step and forming contact holes so as to reach the source region and the drain region of the semiconductor region, the upper electrode of the compensation capacitance, predetermined portions of the source electrode wirings, the cut portions of the gate electrode wirings and the cut portions of the compensation capacitance wirings, respectively; and a pixel electrode material forming step of depositing a pixel electrode material on the substrate after the contact hole forming step and processing the pixel electrode material so as to form a gate electrode wiring connecting portion for connecting both cut portions of the gate electrode wirings, a compensation capacitance connecting portion for connecting both cut portions of the compensation capacitance wirings, a source electrode wiring connecting portion for connecting the predetermined portions of the source electrode wirings and the source region of the semiconductor region and a pixel electrode for connecting to the drain region of the semiconductor region and for connecting to the upper electrode of the compensation capacitance via the respective contact holes, thereby the objective described above being achieved.

Preferably, in the semiconductor region forming step in a method for manufacturing a display control substrate according to the present invention, the semiconductor region is formed on the source electrode wiring as well.

Still preferably, a method for manufacturing a display control substrate according to the present invention further includes a impurity diffusion step between the contact hole forming step and the pixel electrode material forming step, the impurity diffusion step includes diffusing impurity in semiconductor regions via the contact holes in order to reduce a contact resistance, and wherein the pixel electrode material forming step deposits the pixel electrode material on the substrate after the impurity diffusion step.

Herein, a method for manufacturing a display control substrate according to the present invention will be further described.

A method for manufacturing a display control substrate according to the present invention is provided, in which a gate of a transistor element is connected to a gate electrode wiring and a source electrode wiring is connected to a pixel electrode via the transistor element, the method including: a wiring forming step of depositing a metal layer on a substrate and processing the metal layer so as to form the gate electrode wiring and the source electrode wiring in directions so as to intersect each other while one of the gate electrode wiring and the source electrode wiring is cutoff at cut portions such that the other passes between the cut portions; a semiconductor region forming step depositing an insulation film material and a semiconductor material on the substrate in this order after the wiring forming step and processing the insulation film material and the semiconductor material so as to form a semiconductor region on the gate via a gate insulation film, wherein the insulation film material becomes the gate insulation film and the semiconductor material becomes the semiconductor region of the transistor element; a contact hole forming step of depositing an interlayer insulation film on the substrate after the semiconductor region forming step and forming contact holes in the interlayer insulation film so as to reach a source region and a drain region of the semiconductor region and the cut portions, which are portions other than predetermined portions of the source electrode wirings, respectively; and a pixel electrode material forming step of depositing a pixel electrode material on the substrate after the contact hole forming step and processing the pixel electrode material so as to form a connecting portion for connecting both cut portions and for connecting the source region and the source electrode wiring and to form a pixel electrode for connecting to the drain region via the respective contact holes, thereby the objective described above being achieved.

A method for manufacturing a display control substrate according to the present invention is provided, in which a gate of a transistor element is connected to a gate electrode wiring and a source electrode wiring is connected to a pixel electrode via the transistor element, the method including: a semiconductor region forming step of depositing a semiconductor material on a substrate and processing the semiconductor material so as to form a semiconductor region of the transistor element; a wiring forming step of depositing an insulation film material and a metal layer on the substrate in this order after the semiconductor region forming step and processing the metal layer so as to form the gate electrode wiring and the source electrode wiring in directions so as to intersect each other while one of the gate electrode wiring and the source electrode wiring is cutoff at cut portions such that the other passes between the cut portions, wherein the insulation film material becomes a gate insulation film; a contact hole forming step of depositing an interlayer insulation film on the substrate after the wiring forming step and forming contact holes in the interlayer insulation film and the insulation film material so as to reach a source region and a drain region of the semiconductor region and the cut portions, which are portions other than predetermined portions of the source electrode wirings, respectively; and a pixel electrode material forming step of depositing a pixel electrode material on the substrate after the contact hole forming step and processing the pixel electrode material so as to form a connecting portion for connecting both cut portions and for connecting the source region and the source electrode wiring and to form a pixel electrode for connecting to the drain region via the respective contact holes, thereby the objective described above being achieved.

A method for manufacturing a display control substrate according to the present invention is provided, in which a plurality of gate electrode wirings and a plurality of compensation capacitance wirings parallel to each other, and a plurality of source electrode wirings are arranged in directions so as to intersect each other, a gate is connected to the gate electrode wiring in a vicinity of a wiring intersecting portion for each pixel region surrounded by the gate electrode wirings and the source electrode wirings, a transistor element having a source region thereof connected to the source electrode wiring in the vicinity of the wiring intersecting portion, a pixel electrode connected to a drain region of the transistor element and a compensation capacitance formed between the drain region and the compensation capacitance wiring are arranged, the method including: a wiring forming step of depositing a metal layer on a substrate and processing the metal layer so as to form the gate electrode wiring and the compensation capacitance wiring parallel to the gate electrode wiring, and the source electrode wiring in directions so as to intersect each other while one of the gate electrode wiring and the compensation capacitance, and the source electrode wiring is cutoff at cut portions such that the other passes between the cut portions; a semiconductor region forming step of depositing an insulation film material and a semiconductor material on the substrate in this order after the wiring forming step and processing the insulation film material and the semiconductor material so as to form a semiconductor region on the gate via a gate insulation film and to form a semiconductor region as an upper electrode of the compensation capacitance on the compensation capacitance wiring via a compensation capacitance insulation film, wherein the insulation film material becomes the gate insulation film and the compensation capacitance insulation film and the semiconductor material becomes the semiconductor region of the transistor element and the upper electrode of the compensation capacitance; a contact hole forming step of depositing an interlayer insulation film on the substrate after the semiconductor region forming step and forming contact holes in the interlayer insulation film so as to reach the source region and the drain region of the semiconductor region, the upper electrode of the compensation capacitance and the cut portions, which are portions other than predetermined portions of the source electrode wirings, respectively; and a pixel electrode material forming step of depositing a pixel electrode material on the substrate after the contact hole forming step and processing the pixel electrode material so as to form a connecting portion for connecting both cut portions and for connecting the source region and the source electrode wiring and to form a pixel electrode for connecting to the drain region and for connecting to the upper electrode of the compensation capacitance via the respective contact holes, the objective described above being achieved.

A method for manufacturing a display control substrate according to the present invention is provided, in which a plurality of gate electrode wirings and a plurality of compensation capacitance wirings parallel to each other, and a plurality of source electrode wirings are arranged in directions so as to intersect each other, a gate is connected to the gate electrode wiring in a vicinity of a wiring intersecting portion for each pixel region surrounded by the gate electrode wirings and the source electrode wirings, a transistor element having a source region thereof connected to the source electrode wiring in the vicinity of the wiring intersecting portion, a pixel electrode connected to a drain region of the transistor element and a compensation capacitance formed between the drain region and the compensation capacitance wiring are arranged, the method including: a semiconductor region forming step of depositing a semiconductor material on a substrate and processing the semiconductor material so as to form a semiconductor region of the transistor element and to form a semiconductor region as an upper electrode of the compensation capacitance; a wiring forming step of depositing an insulation film material and a metal layer on the substrate in this order after the semiconductor region forming step and processing the metal layer so as to form the gate on the semiconductor region of the transistor element via a gate insulation film while one of the gate electrode wiring and the compensation capacitance wiring parallel to the gate electrode wiring, and the source electrode wiring is cutoff at cut portions such that the other passes between the cut portions and to form the gate electrode wiring and the compensation capacitance wiring, and the source electrode wiring in directions so as to intersect each other such that a part of the compensation capacitance wiring is formed on the upper electrode of the compensation capacitance via a compensation capacitance insulation film, wherein the insulation film material becomes the gate insulation film and the compensation capacitance insulation film; a contact hole forming step of depositing an interlayer insulation film on the substrate after the wiring forming step and forming contact holes in the interlayer insulation film and the insulation film material so as to reach the source region and the drain region of the semiconductor region, the upper electrode of the compensation capacitance and the cut portions, which are portions other than predetermined portions of the source electrode wirings, respectively; and a pixel electrode material forming step of depositing a pixel electrode material on the substrate after the contact hole forming step and processing the pixel electrode material so as to form a connecting portion for connecting both cut portions and for connecting the source region and the source electrode wiring and to form a pixel electrode for connecting to the drain region and for connecting to the upper electrode of the compensation capacitance via the respective contact holes, the objective described above being achieved.

Preferably, the wiring forming step in a method for manufacturing a display control substrate according to the present invention forms the gate electrode wiring, and the source electrode wiring in a direction intersecting the gate electrode wiring and cutoff by a formed portion of the gate electrode wiring.

Still preferably, the wiring forming step in a method for manufacturing a display control substrate according to the present invention forms the source electrode wiring, and the gate electrode wiring in a direction intersecting the source electrode wiring and cutoff by a formed portion of the source electrode wiring.

Still preferably, the wiring forming step in a method for manufacturing a display control substrate according to the present invention forms the gate electrode wiring, the compensation capacitance wiring parallel to the gate electrode wiring, and a source electrode wiring in a direction so as to intersect the gate electrode wiring and the compensation capacitance wiring and cutoff by formed portions of the gate electrode wiring and the compensation capacitance wiring.

Still preferably, the wiring forming step in a method for manufacturing a display control substrate according to the present invention forms the source electrode wiring, a gate electrode wiring in a direction so as to intersect the source electrode wiring and cutoff by a formed portion of the source electrode wiring, and the compensation capacitance wiring parallel to the gate electrode wiring and cutoff by a formed portion of the source electrode wiring.

Still preferably, the contact hole forming step in a method for manufacturing a display control substrate according to the present invention forms the contact holes so as to reach the source region and the drain region of the semiconductor region and the cut portions of the source electrode wirings, respectively; and the pixel electrode material forming step forms, as the connecting portion, a connecting portion for connecting both cut portions of the source electrode wirings and for connecting to the source region and to form a pixel electrode for connecting to the drain region of the semiconductor region.

Still preferably, the contact hole forming step in a method for manufacturing a display control substrate according to the present invention forms the contact holes so as to reach the source region and the drain region of the semiconductor region and the cut portions of the source electrode wirings, respectively; and the pixel electrode material forming step forms, as the connecting portion, a gate electrode wiring connecting portion for connecting both cut portions of the gate electrode wirings, and a source electrode wiring connecting portion for connecting the predetermined portions of the source electrode wirings and the source region of the semiconductor region, as well as forming a pixel electrode for connecting to the drain region of the semiconductor layer.

Still preferably, the contact hole forming step in a method for manufacturing a display control substrate according to the present invention forms the contact holes as to as reach the source region and the drain region of the semiconductor region, the upper electrode of the compensation capacitance and the cut portions of the source electrode wirings, respectively; and the pixel electrode material forming step forms, as the connecting portion, a connecting portion for connecting both cut portions of the source electrode wirings and for connecting to the source region and to form a pixel electrode for connecting to the drain region of the semiconductor region and for connecting to the upper electrode of the compensation capacitance.

Still preferably, the contact hole forming step in a method for manufacturing a display control substrate according to the present invention forms the contact holes so as to reach the source region and the drain region of the semiconductor region, the upper electrode of the compensation capacitance, the predetermined portions of the source electrode wirings, the cut portions of the gate electrode wirings and the cut portions of the compensation capacitance wirings, respectively; and the pixel electrode material forming step forms, as the connecting portion, a gate electrode wiring connecting portion for connecting both cut portions of the gate electrode wirings, a compensation capacitance wiring connecting portion for connecting both cut portions of the compensation capacitance wirings and a source electrode wiring connecting portion for connecting the predetermined portions of the source electrode wirings and the source region of the semiconductor region, as well as forming a pixel electrode for connecting the drain region of the semiconductor region and the upper electrode of the compensation capacitance.

Still preferably, in a method for manufacturing a display control substrate according to the present invention, the gate uses a part of the gate electrode wiring.

Still preferably, the transistor element in a method for manufacturing a display control substrate according to the present invention is an inversely staggered thin film transistor element.

Still preferably, the transistor element in a method for manufacturing a display control substrate according to the present invention is a normally staggered thin film transistor element.

A display control substrate according to the present invention includes a display section in which a plurality of gate electrode wirings and a plurality of source electrode wirings are arranged in directions so as to intersect each other, a gate (either gate electrode or gate region) is connected to the gate electrode wiring in the vicinity of a wiring intersecting portion for each pixel region surrounded by the gate electrode wirings and the source electrode wirings, a transistor element having a source region thereof connected to the source electrode wiring in the vicinity of the wiring intersecting portion and a pixel electrode connected to a drain region of the transistor element are arranged, wherein the gate electrode wiring and the source electrode wiring are formed on the same layer, thereby the objective described above being achieved.

A display control substrate according to the present invention includes a display section in which a plurality of gate electrode wirings and a plurality of compensation capacitance wirings parallel to each other, and a plurality of source electrode wirings are arranged in directions so as to intersect each other, a gate is connected to the gate electrode wiring in the vicinity of a wiring intersecting portion for each pixel region surrounded by the gate electrode wirings and the source electrode wirings, a transistor element having a source region thereof connected to the source electrode wiring in the vicinity of the wiring intersecting portion, a pixel electrode connected to a drain region of the transistor element and a compensation capacitance provided between the drain region and the compensation capacitance wiring are arranged, wherein the gate electrode wiring, the compensation capacitance wiring and the source electrode wiring are formed on the same layer, thereby the objective described above being achieved.

Preferably, in a display control substrate according to the present invention, a drain electrode wiring for connecting the drain region and the pixel electrode is a part of the pixel electrode.

Still preferably, in a display control substrate according to the present invention, the gate electrode wiring and the source electrode wiring are formed in directions so as to intersect each other while one of the gate electrode wiring and the source electrode wiring is cutoff at cut portions such that the other passes between the cut portions, and both cut portions are connected by a pixel electrode material via contact holes.

Still preferably, in a display control substrate according to the present invention, the gate electrode wiring and a compensation capacitance wiring parallel to the gate electrode wiring, and the source electrode wiring are formed in directions so as to intersect each other while one of the gate electrode wiring and the compensation capacitance wiring, and the source electrode wiring is cutoff at cut portions such that the other passes between the cut portions.

Still preferably, in a display control substrate according to the present invention, the source electrode wiring and a compensation capacitance wiring parallel to the source electrode wiring, and the gate electrode wiring are formed in directions so as to intersect each other while one of the source electrode wiring and the compensation capacitance wiring, and the gate electrode wiring is cutoff at cut portions such that the other passes between the cut portions.

Still preferably, the transistor element in a display control substrate according to the present invention is inversely staggered or normally staggered.

Still preferably, the transistor element in a display control substrate according to the present invention is inversely staggered, a source region and a drain region of a semiconductor region are provided on the gate via a gate insulation film, and the source electrode wiring and the source region are connected by the pixel electrode material, and the drain region and the pixel electrode are connected by the pixel electrode material.

Still preferably, the transistor element in a display control substrate according to the present invention is normally staggered, the gate is provided on a source region and a drain region of a semiconductor region via a gate insulation film, and the source electrode wiring and the source region are connected by the pixel electrode material, and the drain region and the pixel electrode are connected by the pixel electrode material.

Still preferably, a display control substrate according to the present invention includes: at a periphery of the display section, a gate driver capable of selectively supplying a scan signal to the plurality of gate electrode wirings; and a source driver capable of selectively supplying a display signal to the plurality of source electrode wirings.

A liquid crystal display panel according to the present invention is provided, in which a display control substrate described above according to the present invention and a counter electrode substrate having a counter electrode arranged thereon so as to oppose the pixel electrode are arranged opposite to each other, and a liquid crystal material is sealed between both substrates, thereby the objective described above being achieved.

An electronic information device according to the present invention uses a display control substrate described above according to the present invention in a liquid crystal display panel, thereby the objective described above being achieved.

With the structures described above, herein after, the functions of the present invention will be described.

In the present invention, the gate electrode wiring, the compensation capacitance (Cs) wiring and the source electrode wiring are simultaneously formed on the same layer, and the cut portions of the source electrode wirings are connected by the transparent electrode material.

For example, in the case of the inversely staggered TFT, first, the gate electrode wiring, the Cs wiring and the source electrode wiring are simultaneously formed. Next, as conventional, the insulation film and the semiconductor region (semiconductor island) are formed. Thereafter, the interlayer insulation film is deposited, and each of the contact holes is formed at a predetermined position in the interlayer insulation film. Thereafter, the impurity is introduced into the semiconductor region in order to improve the contact resistance between the transparent electrode material and the semiconductor island. Lastly, the pixel electrode material (transparent electrode material) is deposited, and the cut portions of the source electrode wirings are connected by the transparent electrode material. Thereafter, the transparent electrode material is etched so as to form the connecting portion and the pixel electrode (transparent electrode). As such, the TFT substrate (display control substrate) is completed.

In other words, the gate electrode wiring, the compensation capacitance (Cs) wiring and the source electrode wiring are formed by using only one mask. In this case, the source electrode wiring is cutoff by at least the gate electrode wiring among the gate electrode wiring and the compensation capacitance (Cs) wiring. The connection between the cut portions of the source electrode wirings, the connection between the source electrode wiring and the source region of the TFT and the connection between the drain region of the TFT and the semiconductor region (semiconductor island) on the compensation capacitance (Cs) wiring are made by the transparent electrode material (ITO layer). As a result, the TFT can be manufactured using four layers of masks.

In another embodiment according to the preset embodiment, the gate electrode wiring, the Cs wiring and the source electrode wiring are simultaneously formed, and the cut portions of the gate electrode wirings and the Cs wiring are connected by the pixel electrode material (transparent electrode material). For example, in the case of the inversely staggered TFT, first, the gate electrode wiring, the Cs wiring and the source electrode wiring are simultaneously formed. Next, as conventional, the insulation film and the semiconductor region (semiconductor island) are formed. Thereafter, the interlayer insulation film is deposited thereon, and each of the contact holes is formed at a predetermined position in the interlayer insulation film. The impurity is introduced into the semiconductor region in order to improve the contact resistance between the transparent electrode material and the semiconductor island. Lastly, the transparent electrode material is deposited, and the cut portions of the gate electrode wirings and the Cs wiring are connected by the transparent electrode material. Thereafter, the transparent electrode material is etched so as to form the connecting portion and the pixel electrode (transparent electrode). As such, the TFT substrate (display control substrate) is completed.

As described above, at least the gate electrode wiring and the source electrode wiring among the gate electrode wiring and the Cs wiring, and the source electrode wiring, which intersect each other, are simultaneously formed. Further, the cut portions of the source electrode wirings or the gate electrode wiring are connected by the pixel electrode material. Therefore, the source/drain electrode wiring forming step, which is conventionally needed, is not required, and thus it is possible to reduce the number of masks. For example, in the case of the inversely staggered TFT, it is possible to fabricate the display control substrate, such as TFT substrate, using four layers of masks for the gate electrode wiring/Cs wiring/source electrode wiring, the semiconductor island, the contact hole and the transparent electrode.

Further, by diffusing the impurity into a contact hole portion (semiconductor region via the contact hole) of the interlayer insulation film, it is possible to reduce the contact resistance and fabricate a TFT with excellent properties.

As described above, according to the present invention, the gate electrode wiring and the source electrode wiring intersecting each other are simultaneously formed. Therefore, the number of masks used can be reduced, and thus it is possible to realize the reduction of the lead time, the increase of the yield and the reduction of the manufacturing cost.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

Portion (a) of FIG. 1 is a top view showing an exemplary essential structure of a TFT substrate in an embodiment according to the present invention; Portion (b) of FIG. 1 is a cross-sectional view of A-A line in Portion (a) of FIG. 1; Portion (c) of FIG. 1 is a cross-sectional view of B-B line in Portion (a) of FIG. 1; and Portion (d) of FIG. 1 is a cross-sectional view of C-C line in Portion (a) of FIG. 1.

Figure 1:
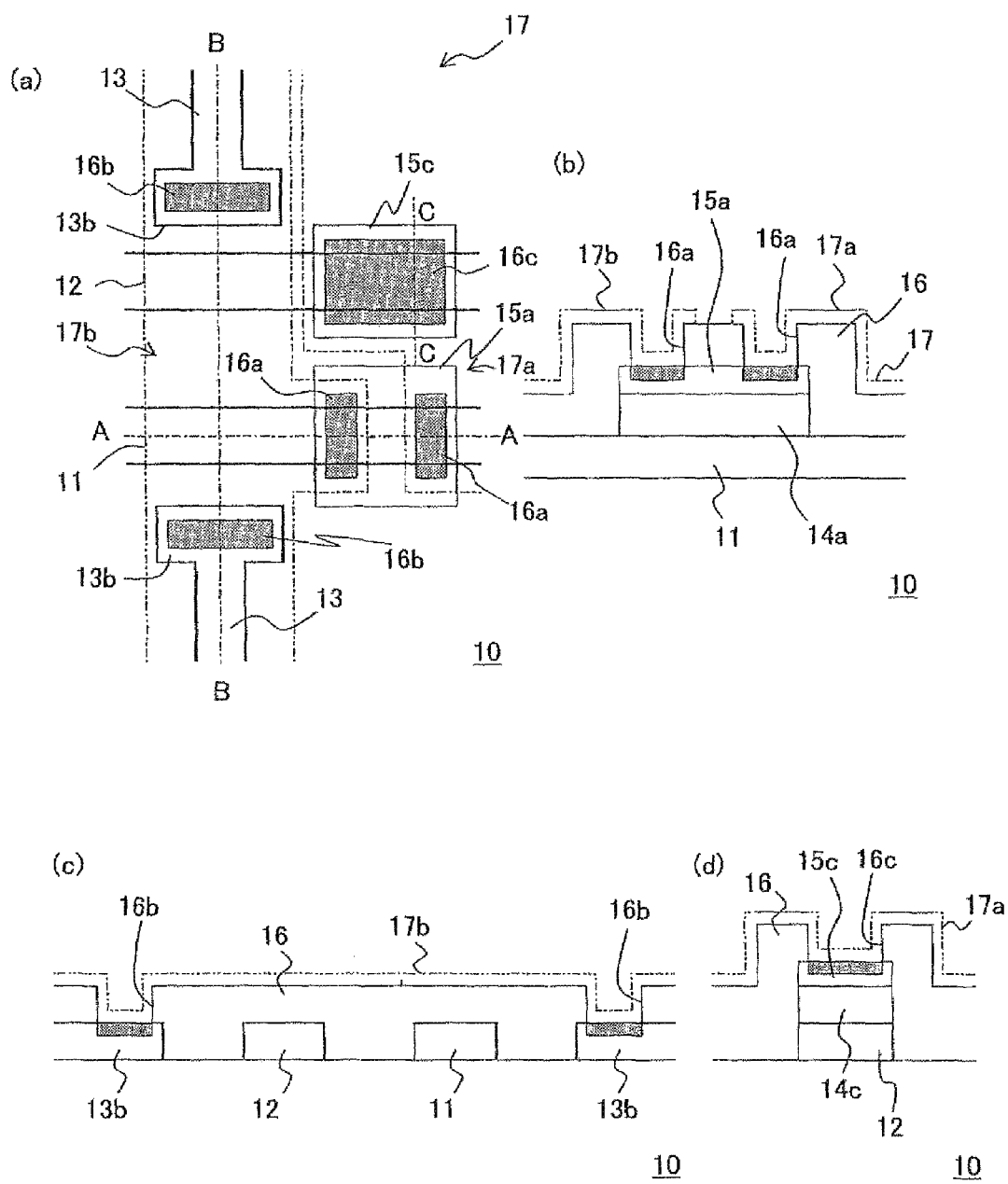
Figure 3:
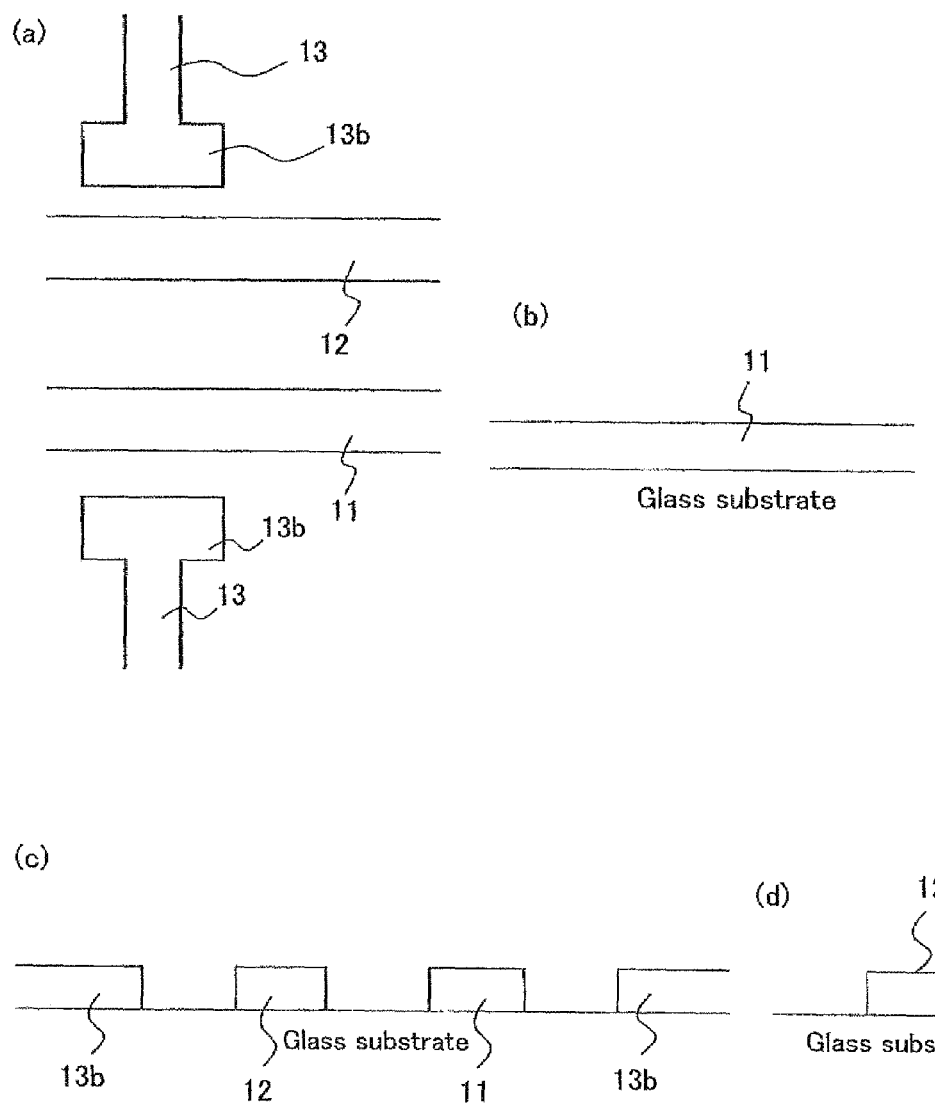

Portion (a) of FIG. 3 is a top view for describing a step of manufacturing the TFT substrate (1) in FIG. 1; Portion (b) of FIG. 3 is a cross-sectional view of a portion corresponding to A-A line in Portion (a) of FIG. 1; Portion (c) of FIG. 3 is a cross-sectional views of a portion corresponding to B-B line in Portion (a) of FIG. 1; and Portion (d) of FIG. 3 is a cross-sectional views of a portion corresponding to C-C line in Portion (a) of FIG. 1.

Portion (a) of FIG. 4 is a top view for describing a step of manufacturing the TFT substrate (2) in FIG. 1; Portion (b) of FIG. 4 is a cross-sectional view of a portion corresponding to A-A line in Portion (a) of FIG. 1; Portion (c) of FIG. 4 is a cross-sectional views of a portion corresponding to B-B line in Portion (a) of FIG. 1; and Portion (d) of FIG. 4 is a cross-sectional views of a portion corresponding to C-C line in Portion (a) of FIG. 1.

Figure 5:
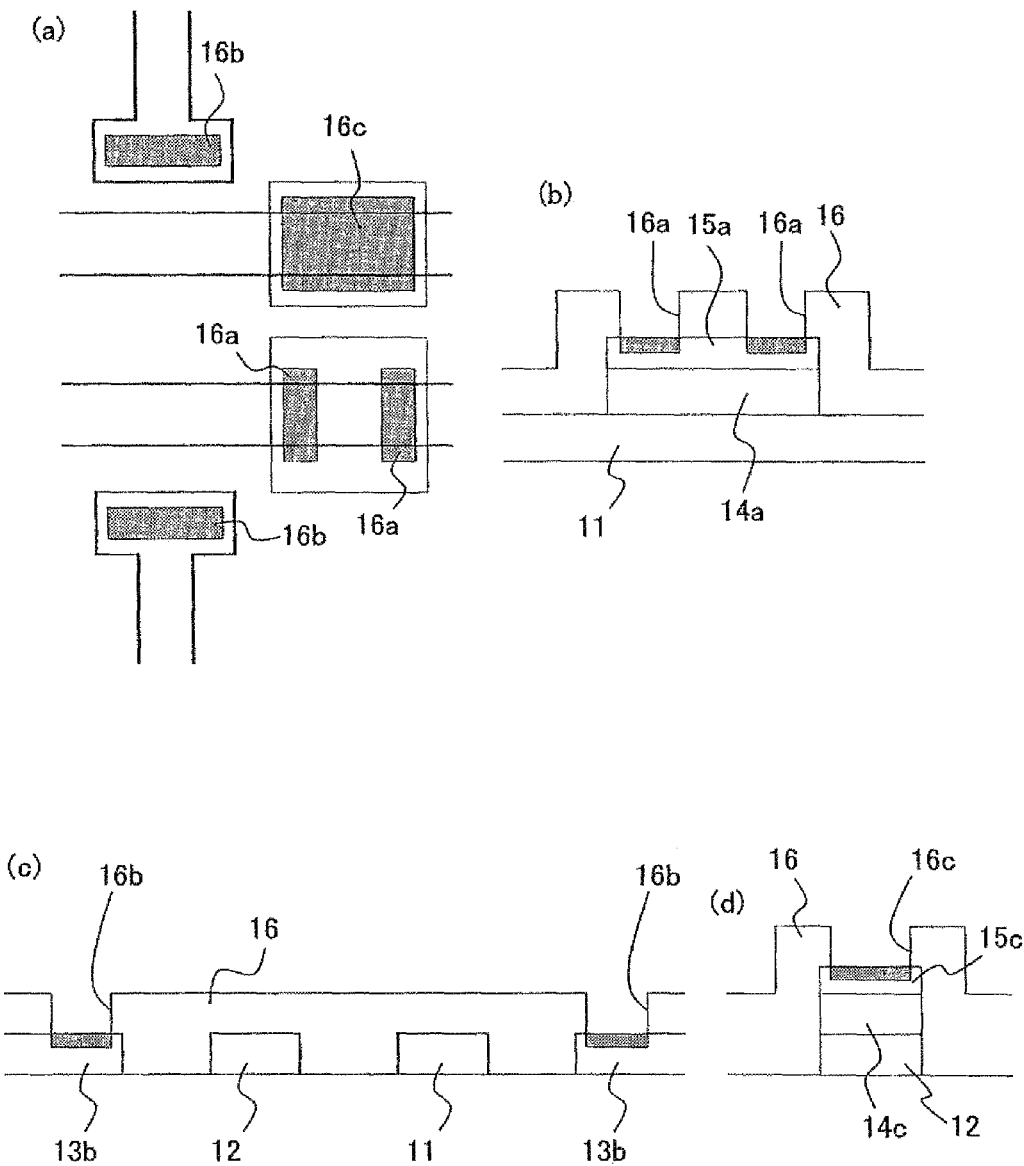

Portion (a) of FIG. 5 is a top view for describing a step of manufacturing the TFT substrate (3) in FIG. 1; Portion (b) of FIG. 5 is a cross-sectional view of a portion corresponding to A-A line in Portion (a) of FIG. 1; Portion (c) of FIG. 5 is a cross-sectional views of a portion corresponding to B-B line in Portion (a) of FIG. 1; and Portion (d) of FIG. 5 is a cross-sectional views of a portion corresponding to C-C line in Portion (a) of FIG. 1.

Figure 6:
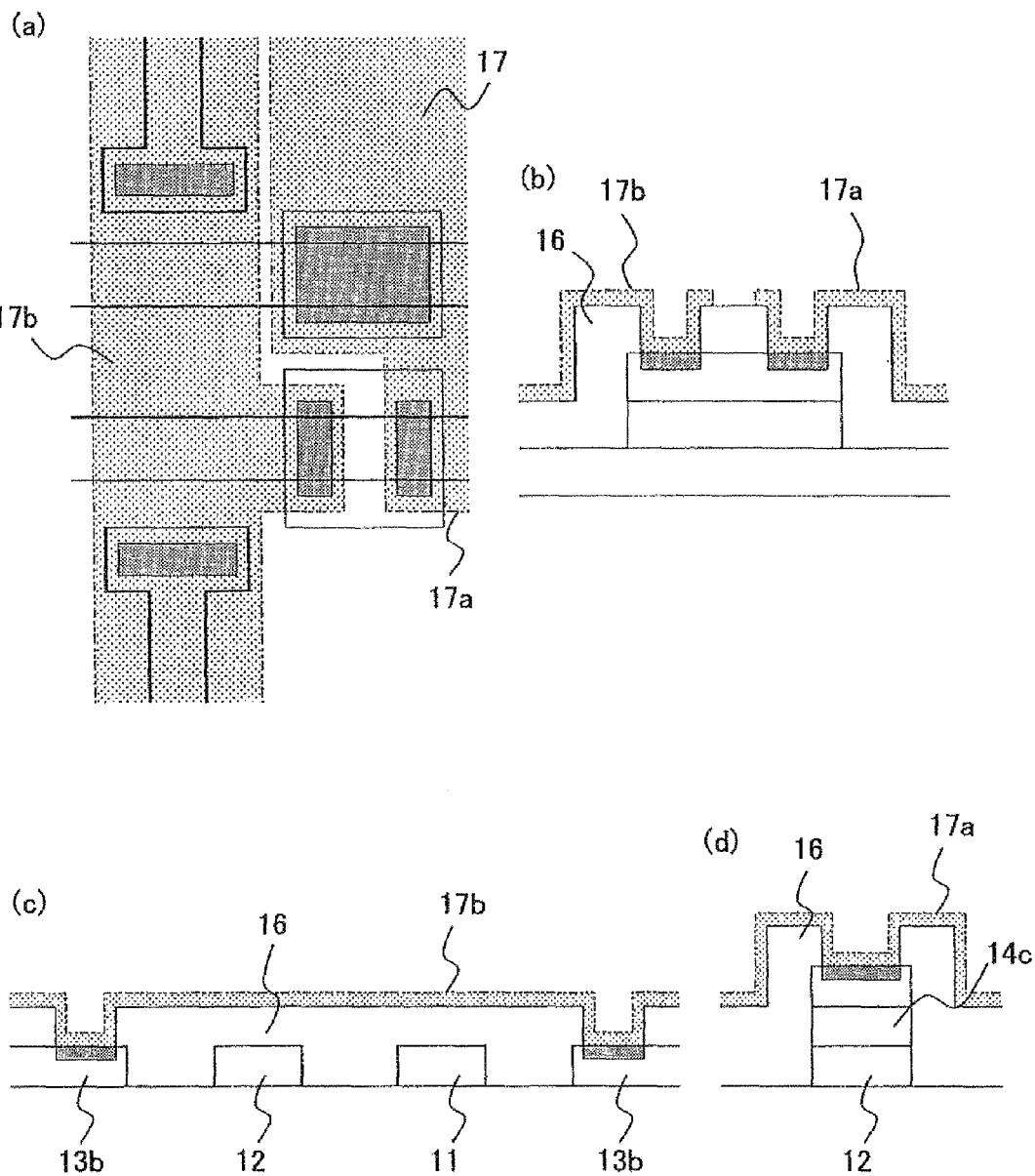

Portion (a) of FIG. 6 is a top for describing a step of manufacturing the TFT substrate (4) in FIG. 1; Portion (b) of FIG. 6 is a cross-sectional view of a portion corresponding to A-A line in Portion (a) of FIG. 1; Portion (c) of FIG. 6 is a cross-sectional views of a portion corresponding to B-B line in Portion (a) of FIG. 1; and Portion (d) of FIG. 6 is a cross-sectional views of a portion corresponding to C-C line in Portion (a) of FIG. 1.

Figure 8:
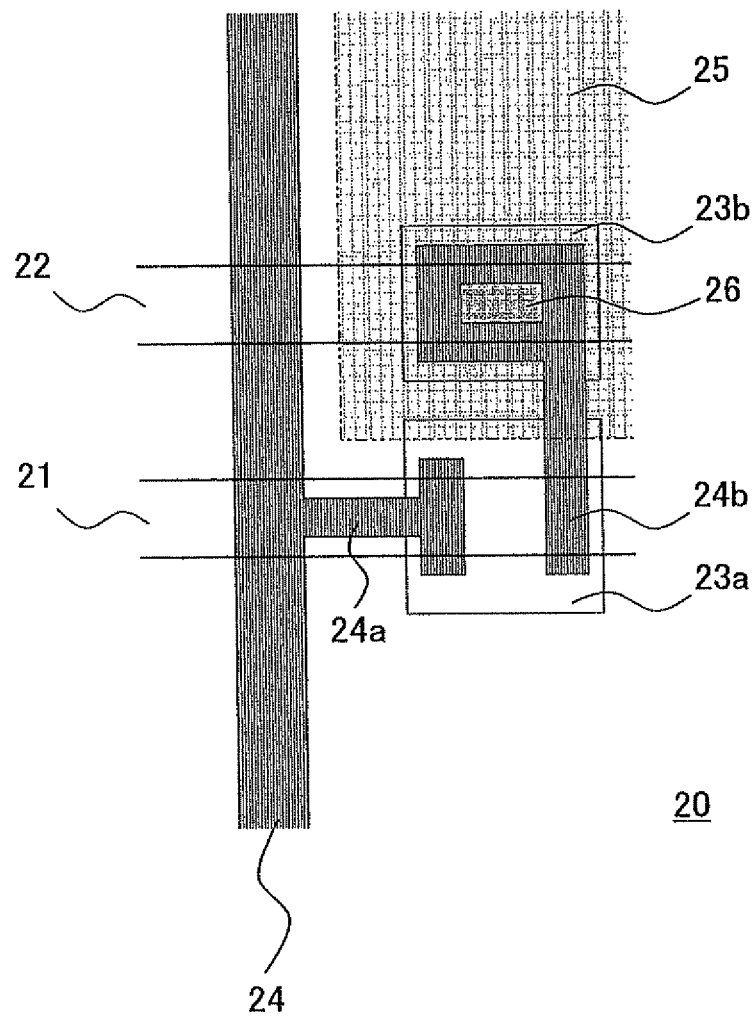

Portion (a) of FIG. 7 is an equivalent circuit diagram showing a TFT portion in the TFT substrate according to the present embodiment; and Portion (b) of FIG. 7 is an equivalent circuit diagram showing a TFT portion in a conventional TFT substrate shown in FIG. 8.

FIG. 8 is a top view showing an exemplary essential structure of the conventional TFT substrate.

Figure 9:
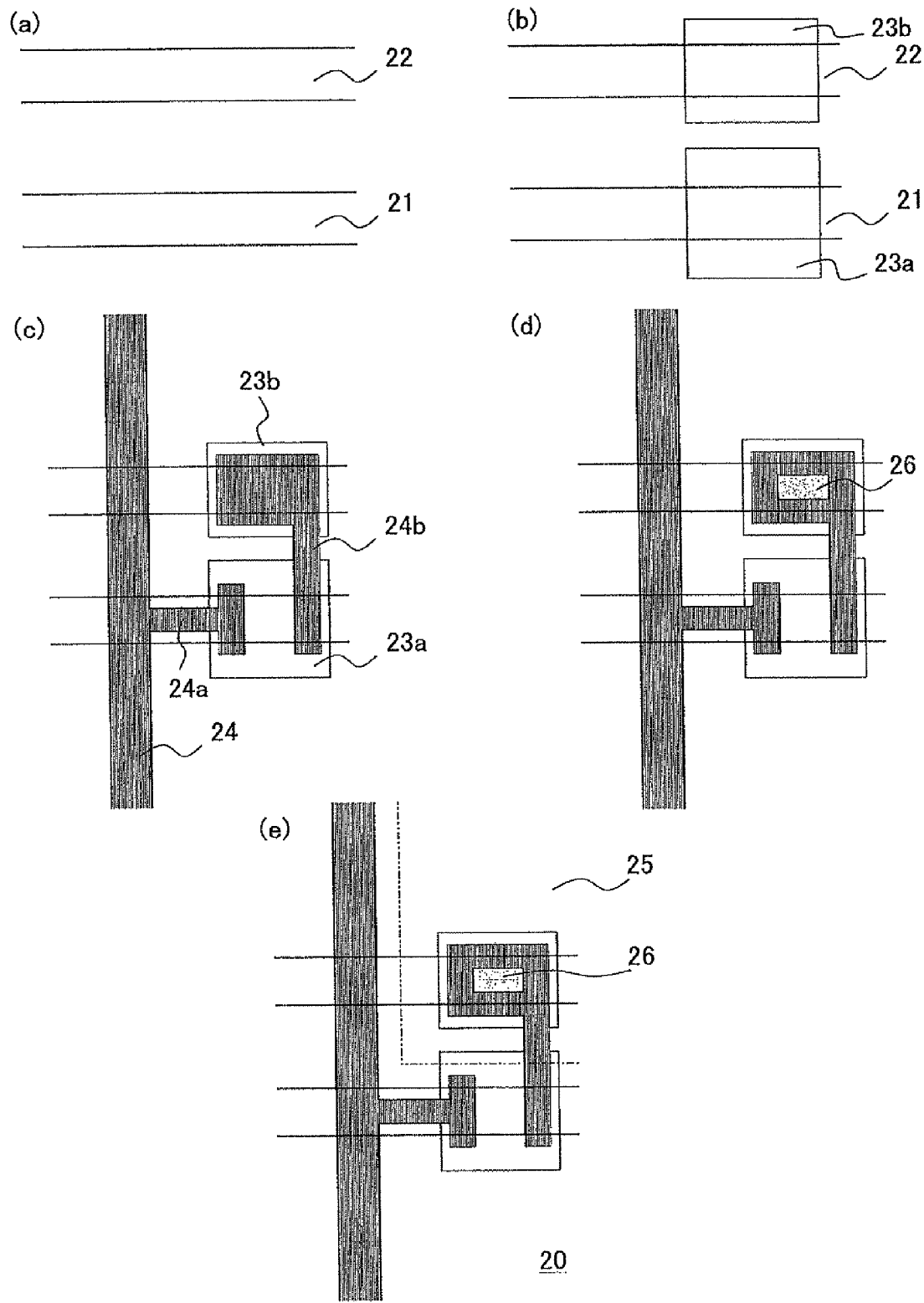

Portions (a) to (e) of FIG. 9 are top views for describing each step of the manufacturing of the conventional TFT substrate.

DETAILED DESCRIPTION OF PREFERRED EMBODIMENTS

Hereinafter, a case when a display control substrate according to the present invention and a method for manufacturing the display control substrate are applied to a TFT substrate in a pixel section of a liquid crystal display device will be described with reference to the accompanying drawings.

Portion (a) of FIG. 1 is a top view showing an exemplary essential structure of a TFT substrate in an embodiment according to the present invention. Portion (b) of FIG. 1 is a cross-sectional view of A-A line in Portion (a) of FIG. 1. Portion (c) of FIG. 1 is a cross-sectional view of B-B line in Portion (a) of FIG. 1. Portion (d) of FIG. 1 is a cross-sectional view of C-C line in Portion (a) of FIG. 1.

As shown in Portion (a) of FIG. 1, on a TFT substrate 10, gate electrode wirings 11 and compensation capacitance (Cs) wirings 12 are repeatedly provided in one direction while being parallel to each other. In a direction intersecting (here, orthogonal) to both of the aforementioned wirings, a source electrode wiring 13 is formed at each predetermined gap while the source electrode wiring 13 is cutoff by the formed portions of both wirings (space is provided). As shown in Portion (b) of FIG. 1, on the gate electrode wiring 11, a semiconductor island 15a which becomes a channel region of the TFT is provided via a gate insulation film 14a. As shown in Portion (d) of FIG. 1, on the compensation capacitance wiring 12, a semiconductor island 15c which becomes a compensation capacitance upper electrode is provided via a compensation capacitance insulation film 14c.

As shown in Portion (c) of FIG. 1, an interlayer insulation film 16 is provided so as to cover the substrate 10. In the interlayer insulation film 16, contact holes 16a to 16c are provided for the semiconductor island 15a, both cut portions 13b of the source electrode wirings 13 and the semiconductor island 15c, respectively. On portions (semiconductor layers) via the respective contact holes 16a to 16c of the interlayer insulation film 16, impurity diffusion regions are provided in order to reduce the contact resistance.

As shown in Portion (c) of FIG. 1, a transparent electrode (pixel electrode) 17 is provided on the interlayer insulation film 16. This transparent electrode 17 includes a connecting portion 17b for connecting both cut portions 13b of the source electrode wirings 13 and for connecting to a source region of the semiconductor island 15a; and a connecting portion 17a for connecting a drain region of the semiconductor island 15a and the semiconductor island (compensation capacitance upper electrode) 15c. In the pixel section, the transparent electrode 17 is provided for each pixel region surrounded by the gate electrode wirings 11 and the source electrode wirings 13, and it is used as a pixel electrode. The connecting portion 17a of the transparent electrode 17 is used as a drain electrode wiring.

Figure 2:
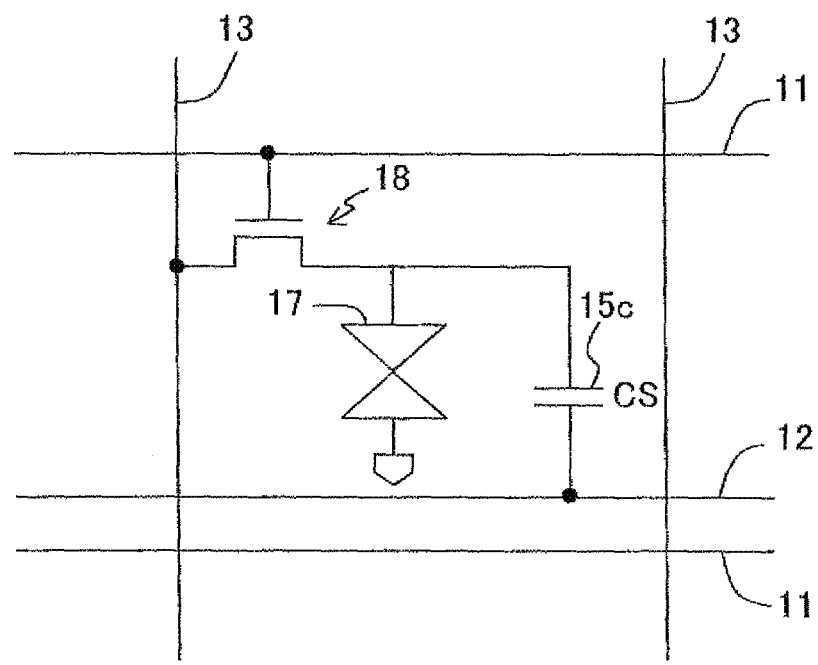
FIG. 2 is a circuit diagram showing an exemplary structure of a pixel of a display section in the TFT substrate in FIG. 1.

FIG. 2 is a circuit diagram showing an exemplary structure of a pixel of a display section in the TFT substrate 10 in FIG. 1.

In FIG. 2, in the display section where the TFT substrate 10 is used as the display control substrate, a plurality of gate electrode wirings 11 and a plurality of compensation capacitance wirings 12 parallel to each other, and a plurality of source electrode wirings 13 are provided in directions so as to intersect each other. For each pixel region surrounded by the gate electrode wirings 11 and the source electrode wirings 13, a gate electrode is connected to the gate electrode wiring 11 in the vicinity of the wiring intersecting portion. The source electrode wiring 13 in the vicinity of the wiring intersecting portion includes: a TFT 18 as a transistor element connected to the source region; a pixel electrode 17 connected to the drain region of the TFT 18; and a compensation capacitance Cs provided between the drain region and the compensation capacitance wiring 12. A gate driver (not shown) capable of selectively supplying a scan signal (control signal) for the TFT 18 to the plurality of gate electrode wirings 11; and a source driver (not shown) capable of selectively supplying a display signal for driving the pixel electrode to the plurality of source electrode wirings 13 are provided at the periphery of the display section having a multiplicity of pixel electrodes 17 provided thereon in a matrix.

In this case, the gate electrode wiring 11, the compensation capacitance wiring 12 and the source electrode wiring 13 are provided on the same layer of the TFT substrate 10. The gate electrode wiring 11 and the source electrode wiring 13 are formed in directions so as to intersect each other while the source electrode wirings 13 are cutoff at the cut portions 13a such that the gate electrode wiring 11 and the compensation capacitance wiring 12 pass between the cut portions 13a. The cut portions 13 bare connected to each other by the transparent electrode material via the contact holes 16b and the source region of the semiconductor island 15a (source region, channel region and drain region) is connected to the transparent electrode material via the contact hole 16a. In addition, the drain electrode wiring, in which the drain region of the semiconductor island 15a and the pixel electrode 17 are connected by the transparent electrode material, is a part of the pixel electrode 17.

With the structure described above, herein after, a method for manufacturing the TFT substrate 10 according to the present embodiment will be described in detail with reference to FIG. 3 to FIG. 6.

Portions (a) of FIG. 3 to FIG. 6 are top views showing exemplary essential structures for describing each step of manufacturing the TFT substrate 10 in FIG. 1. Portions (b) of FIG. 3 to FIG. 6 are cross-sectional views of a portion corresponding to A-A line in Portion (a) of FIG. 1. Portions (c) of FIG. 3 to FIG. 6 are cross-sectional views of a portion corresponding to B-B line in Portion (a) of FIG. 1. Portions (d) of FIG. 3 to FIG. 6 are cross-sectional views of a portion corresponding to C-C line in Portion (a) of FIG. 1.

As shown in Portion (a) of FIG. 3 to Portion (d) of FIG. 3, first, a step of forming the gate electrode wiring 11, the compensation capacitance wiring 12 and the source electrode wiring 13 is performed. In this step, a glass substrate is cleaned by a WET cleaning or a DRY cleaning. On the glass substrate, a metal material (e.g., aluminum) which becomes the gate electrode wiring 11, the compensation capacitance (Cs) wiring 12 and the source electrode wiring 13 is deposited by a sputtering method or a CVD method. The film thickness of the metal material is generally around 500 nm and may be a film thickness obtained from a design value such as a gate line width, operating voltage and operating speed.

A resist mask is formed by a photolithography method, and an etching is performed thereon by a WET (wet) etching method or a DRY (dry) method. As shown in Portion (a) of FIG. 3 to Portion (d) of FIG. 3, the gate electrode wiring 11 and the compensation capacitance wiring 12 are formed parallel to each other with a predetermined gap there between, and the source electrode wirings 13 are formed in a direction perpendicular to the gate electrode wiring 11 and the compensation capacitance wiring 12 and with a gap equivalent to the width of the gate electrode wiring 11 and the compensation capacitance wiring 12. The resist mask is removed by a WET method or a DRY method. In this case, in the present embodiment, the source electrode wirings 13 are formed while the source electrode wirings 13 are cutoff by the formed portions of the gate electrode wiring 11 and the compensation capacitance wiring 12 (space is provided), such that the gate electrode wiring 11, the compensation capacitance wiring 12 and the source electrode wirings 13 do not contact one another. The cut portions 13*b* of the source electrode wirings 13 are formed such that they are larger than the other are as for contact since the cut portions 13*b* are connected by the transparent electrode material to be formed later.

Herein, compared with the prior art shown in Portion (a) of FIG. 9 described above, in the prior art shown in Portion (a) of FIG. 9 described above, the gate electrode wiring 21 and the compensation capacitance wiring 22 are formed in this step. In contrast, in the present embodiment, simultaneous to the formation of the gate electrode wiring 11 and the compensation capacitance wiring 12, the source electrode wiring 13 is formed.

Next, as shown in Portion (a) of FIG. 4 to Portion (d) of FIG. 4, a step of depositing an insulation film which becomes the gate insulation film 14*a* and the compensation capacitance insulation film 14*c* and forming the semiconductor islands 15*a* and 15*c* is performed. In this step, the insulation film which becomes the gate insulation film 14*a* and the compensation capacitance insulation film 14*c*, and an intrinsic semiconductor layer which becomes the channel region of the TFT and the compensation capacitance upper electrode are deposited by the CVD method so as to form an n-type semiconductor layer. The film thicknesses of these insulation films and the semiconductor layer are about 1000 nm and about 500 nm, respectively.

A resist mask is formed by the photolithography method, and an etching is performed thereon by the WET etching method or the DRY etching method so as to form the semiconductor islands 15*a* and 15*c* on the gate electrode wiring 11 and the compensation capacitance wiring 12, respectively, as shown in FIG. 4. The resist mask is removed by the WET method or the DRY method.

In the prior art shown in Portion (b) of FIG. 9, in this step, the insulation film and the intrinsic semiconductor layer are deposited so as to form the impurity-doped semiconductor layer (semiconductor region), and the semiconductor islands are formed by the photolithography method and the etching method. However, in the prior art shown in Portion (b) of FIG. 9, in order to maintain the insulation between the source/drain electrode wirings, which are to be formed later, and the gate electrode wiring, a method allowing about 500 nm of the insulation film, which is deposited by the CVD method, to remain is employed. In contrast, in the present embodiment, a step of forming the source/drain electrode wirings is not performed. Further, since an electrical contact between the source electrode wiring formed earlier and the transparent electrode to be formed later is required, the insulation film is etched so as to expose the glass substrate such that no insulation film remains on any portion other than the portion where the semiconductor islands are located.

In the prior art shown in Portion (c) of FIG. 9, after the formation of the semiconductor islands, the metal material which becomes the source/drain electrode wirings is deposited by the sputtering method or the like, and the source/drain electrodes and the channel region of the transistor are formed by the photolithography method and the etching method. The present embodiment does not require the step of forming the source/drain electrode wirings.

As shown in Portion (a) of FIG. 5 to Portion (d) of FIG. 5, a step of depositing the interlayer insulation film 16 and forming the contact holes 16*a* to 16*c* is performed. In this step, in order to electrically insulate the gate electrode wiring 11, the compensation capacitance wiring 12 and the source electrode wiring 13, and the transparent electrode 17, which is to be formed in a later step, the interlayer insulation film 16 is deposited by the CVD method or the like on the substrate after the step of depositing the insulation film and forming the semiconductor islands 15*a* and 15*c*. The film thickness of the interlayer insulation film 16 is generally about several μm, yet may differ depending on the dielectric constant of the insulation film and the operating voltage of the TFT.

In order to form a contact section with the transparent electrode material, which is to be formed in a later step, a resist mask is formed by the photolithography, and an etching is performed thereon by the WET etching method or the DRY etching method so as to form the contact holes 16*a* to 16*c* on the semiconductor island 15*a* which becomes the channel region of the TFT, on the cut portions 13*b* of the source electrode wirings 13, and on the semiconductor island 15*c* which becomes the compensation capacitance upper electrode, respectively. The resist mask is removed by the WET method or the DRY method.

In the prior art shown in Portion (d) of FIG. 9, in this step, the contact hole 26 is formed only on the semiconductor island 23*b* which becomes the compensation capacitance upper electrode. In contrast, in the present embodiment, as shown in Portion (a) of FIG. 5 to Portion (d) of FIG. 5, it is necessary to form the contact holes 16*a* to 16*c* on the semiconductor islands 15*a* and 15*c* and on the cut portions 13*b* of the source electrode wirings 13, respectively.

Impurity is diffused in the semiconductor layers via the contact holes 16*a* to 16*c* in order to adjust the resistance between the transparent electrode material, which is to be deposited later, and the n+ regions (semiconductor layers via the contact holes). In the diffusion method in this case, the diffusion can be conducted on the entire substrate since the regions other than the contact holes 16*a* to 16*c* are protected by the insulation film, and a vapor-phase diffusion method, anion implantation method or a solid-phase diffusion method of applying a diffusion source containing impurity can be used, for example. Further, in order to activate the diffused impurity, a thermal treatment with a temperature of about 40° C. can be applied if necessary.

Lastly, as shown in Portion (a) of FIG. 6 to Portion (d) of FIG. 6, in order to form a connection section of the source electrode wiring and to form the transparent electrode 17, which includes the drain electrode wiring, a step of depositing and etching the transparent electrode material is performed. In this step, the transparent electrode material is deposited by the sputtering method or the CVD method on the substrate after the step of depositing the interlayer insulation film 16 and forming the contact holes 16*a* to 16*c*. The film thickness of the transparent electrode material may be several hundreds of nanometers citing conventionally-used electrode material Indium-Tin-Oxide (ITO) as an example.

A resist mask is formed by the photolithography, and an etching is performed thereon by the WET etching method or the DRY etching method so as to form the transparent electrode 17, which includes the connecting portion 17*b* for connecting both cut portions of the source electrode wirings 13 and for connecting to the source region of the semiconductor island 15a; and the connecting portion 17a (drain electrode wiring portion) for connecting the drain region of the semiconductor island 15a and the semiconductor island 15a (compensation capacitance upper electrode) 15c. The resist mask is removed by the WET method or the DRY method.

In the prior art shown in Portion (e) of FIG. 9, in this step, only the transparent electrode 25 is formed. In the present embodiment, this step also forms the source/drain electrode wirings.

The TFT substrate 10 is arranged opposite to a counter substrate having a counter electrode arranged thereon with a predetermined gap there between. The surrounding thereof is bonded. A liquid crystal material is implanted from an implantation opening into the gap between the substrates and the implantation opening is sealed. As such, a liquid crystal panel is formed.

As described above, according to the present embodiment, the gate electrode wiring 11, the Cs wiring 12 and the source electrode wiring 13 are simultaneously formed, and the cut portions 13b of the source electrode wirings 13 are connected by the same material film as the transparent electrode 17. In the case of the inversely staggered TFT, the gate electrode wiring 11, the Cs wiring 12 and the source electrode wiring 13 are simultaneously formed. After the gate insulation film 14a, the compensation capacitance insulation film 14c and the semiconductor islands 15a and 15c are formed, the interlayer insulation film 16 is deposited and then, the contact holes 16a to 16c are formed in the interlayer insulation film 16. After the impurity is introduced into (the semiconductor layers at) the bottom of the contact holes, the material for the transparent electrode 17 is deposited on the interlayer insulation film 16 and the contact holes 16a to 16c formed therein. Both cut portions 13b and 13b of the source electrode wirings are connected by the connecting portion 17b with the same material as the transparent electrode 17 and the connecting portion 17b is also connected with the source region of the semiconductor island 15a. Accordingly, the step of forming the source/drain electrode wirings, which is conventionally needed, is not required and thus it is possible to reduce the number of masks.

In other words, in the conventional method for manufacturing the TFT substrate, for example, in the case of the inversely staggered TFT, five layers of masks are required for: the step of forming the gate electrode wiring/Cs wiring; the step of forming the semiconductor islands; the step of forming the source electrode wiring/drain electrode wiring; the step of forming the contact holes; and the step of forming the transparent electrode. This is the cause of increasing the lead time, reducing the yield and increasing the manufacturing cost. In contrast, in the present embodiment, in the case of the inversely staggered TFT, only four layers of masks are required for: the step of forming the gate electrode wiring/Cs wiring/source electrode wiring; the step of forming the semiconductor islands; the step of forming the contact holes; and the step of forming the transparent electrode. Thus, it is possible owing to the simplified steps to realize the reduction of the lead time, the increase of the yield and the reduction of the manufacturing cost.

The TFT substrate 10 as the display control substrate and the method for manufacturing the TFT substrate 10 described above are merely an example. For example, in the step of forming the wirings shown in Portion (a) of FIG. 3 to Portion (c) of FIG. 3, the source electrode wirings can be completely formed without being cutoff there between and only portions of the gate electrode wiring and the compensation capacitance wiring can be formed while the gate electrode wirings and the compensation capacitance wirings are cutoff by the formed portion of the source electrode wiring (space is provided). In the step of forming the contact holes shown in Portion (a) of FIG. 5 to Portion (d) of FIG. 5, the contact holes are formed on the cut portions of the gate electrode wirings and the cut portions of the compensation capacitance wirings, respectively. In the step of forming the transparent electrode shown in Portion (a) of FIG. 6 to Portion (d) of FIG. 6, the connecting portion for connecting both cut portions of the gate electrode wirings by the transparent electrode material; the connecting portion for connecting both cut portions of the compensation capacitance wirings by the transparent electrode material; the transparent electrode including the drain electrode wiring; and the source wiring portion can be formed.

In the embodiment described above, the gate electrode wiring 11 and the compensation capacitance wiring 12, which is parallel to the gate electrode wiring 11, and the source electrode wiring 13 are formed in a direction so as intersect each other while one of the compensation capacitance wiring 12 and the gate electrode wiring 11, and the source electrode wiring 13 is cutoff at the cut portions such that the other passes between the cut portions. However, the present invention is not limited to this. It is possible to form the source electrode wiring 13 and the compensation capacitance wiring 12, which is parallel to the source electrode wiring 13, and the gate electrode wiring 11 in directions so as to intersect each other while one of the compensation capacitance wiring 12 and the source electrode wiring 13, and the gate electrode wiring 11 is cutoff at the cut portions such that the other passes between the cut portions.

In the TFT substrate 10 in the present embodiment, the cut portions 13b of the source electrode wirings 13 are connected by the connecting portion 17b, which is formed at the same time as the transparent electrode 17, and the transparent electrode 17 is also connected to the source region of the semiconductor island 15a. Since the drain region of the semiconductor island 15a and the semiconductor island (a part of the compensation capacitance upper electrode) 15c are connected by the connecting portion 17a, which is a part of the transparent electrode 17, the total resistance is slightly increased compared to the conventional TFT substrate 20, in which the source electrode wiring and the drain electrode wiring are formed with the metal layer. This will be described with reference to Portion (a) of FIG. 7 and Portion (b) of FIG. 7.

Portion (a) of FIG. 7 is an equivalent circuit diagram showing a TFT portion in the TFT substrate 10 according to the present embodiment. Portion (b) of FIG. 7 is an equivalent circuit diagram showing a TFT portion in the conventional TFT substrate 20 shown in FIG. 8.

As shown in Portion (a) of FIG. 7, in the TFT substrate 10 according to the present invention, (1) the resistance at a source contact section connected by the transparent electrode (ITO) is about 50 k$\Omega$, (2) the resistance at the TFT is about $10^6 \Omega$ when the TFT is on, (3) the resistance at a drain contact section connected by the transparent electrode (ITO) is about 50 k$\Omega$, (4) the contact resistance between the cut portion (aluminum) of the source electrode wiring and the transparent electrode (ITO) is about 50 k$\Omega$, (5) the resistance at the source electrode wiring (aluminum) is about 1 k$\Omega$, and (6) the resistance at the transparent electrode (a portion which is used as a part of the source electrode wiring) is about 10 k$\Omega$. Therefore, the total resistance is about 1.171M$\Omega$.

As shown in Portion (b) of FIG. 7, in the conventional substrate 20, (1) the resistance at a source contact section connected by the source electrode wiring (aluminum) is about 10 k$\Omega$, (2) the resistance at the TFT is about $10^6 \Omega$ when the TFT is on, (3) the resistance at a drain contact section connected by the drain electrode wiring (aluminum) is about 10 kΩ, (4) the contact resistance between the drain electrode wiring (aluminum) and the transparent electrode (ITO) is about 10 kΩ, and (5) the resistance at the source electrode wiring (aluminum) is about 1 kΩ. Therefore, the total resistance is about 1.031 MΩ.

As such, the total resistance at the TFT substrate 10 according to the present embodiment is about 13.6% higher than that of the conventional TFT substrate 20. The increase of this amount of resistance value does not cause a particular problem. However, if necessary, it is possible to reduce the resistance value by enlarging the size of the area of the contact sections up to approximately five times the original size. For example, in the example described above, it is possible to reduce the resistance at the contact sections by enlarging the size of the areas of the contact holes 16a to 16c.

The embodiment described above has described the TFT substrate 10 having the inversely staggered TFT as the switching element (transistor element) of the pixel section in the liquid crystal display device. However, the present invention is not limited to this. The present invention can be applied to a TFT substrate having a TFT with other structures (such as normally staggered TFT).

A TFT as a transistor element can be not only inversely staggered, but also normally staggered. The inversely staggered TFT and the normally staggered TFT will be described.

When the TFT is inversely staggered, the source region and the drain region of the semiconductor region (semiconductor island 15a) are provided on the gate electrode (a part of the gate electrode wiring 11) via the gate insulation film. The source electrode wiring 13 and the source region are connected by the transparent electrode material and the drain region and the transparent electrode 17 are connected to each other by the transparent electrode material.

A method for manufacturing the TFT substrate 10 in the case of the inversely staggered TFT includes: a wiring forming step of depositing a metal layer (e.g., aluminum) on a substrate and processing the metal layer so as to form the gate electrode wiring 11 and the source electrode wiring 13 in a direction intersecting the gate electrode wiring 11 and cutoff by the formed portion of the gate electrode wiring 11; a semiconductor region forming step of depositing an insulation film material which becomes the gate insulation film 14a and a semiconductor material which becomes the semiconductor island 15a of the TFT 18 on the substrate in this order after the wiring forming step and processing the insulation film material and the semiconductor material so as to form the semiconductor island 15a on the gate electrode via the gate insulation film 14a; a contact hole forming step of depositing the interlayer insulation film 16 on the substrate after the semiconductor region forming step and forming the contact holes 16a and 16b in the interlayer insulation film 16 so as to reach the source region and the drain region of the semiconductor island 15a and the cut portions 13b of the source electrode wirings 13, respectively; and a pixel electrode material forming step of depositing the transparent electrode material on the substrate after the contact hole forming step and processing the transparent electrode material so as to form a source electrode wiring connecting portion for connecting both cut portions 13b of the source electrode wirings 13 and for connecting to the source region, and to form the transparent electrode 17 for connecting to the drain region via the respective contact holes 16a and 16b.

When the TFT is normally staggered, the gate electrode (a part of the gate electrode wiring) is provided on the source region and the drain region of the semiconductor island via the gate insulation film. The source electrode wiring and the source region are connected by the transparent electrode material, and the drain region and the transparent electrode are connected to each other.

A method for manufacturing the TFT substrate in the case of the normally staggered TFT includes: a semiconductor region forming step of depositing a semiconductor material on a substrate and processing the semiconductor material so as to form a semiconductor region (semiconductor island) of the TFT; a wiring forming step of depositing an insulation film material which becomes the gate insulation film and a metal layer on the substrate in this order after the semiconductor region forming step and processing the metal layer so as to form the gate electrode wiring and the source electrode wiring in a direction intersecting the gate electrode wiring and cutoff by the formed portion of the gate electrode wiring and form a gate electrode on the semiconductor region via the gate insulation film; a contact hole forming step of depositing an interlayer insulation film on the substrate after the wiring forming step and forming contact holes in the interlayer insulation film and the insulation film material so as to reach the source region and the drain region of the semiconductor region, and the cut portions of the source electrode wirings, respectively; and a pixel electrode material forming step of depositing a pixel electrode material on the substrate after the contact hole forming step and processing the pixel electrode material so as to form a connecting portion for connecting both cut portions of the source electrode wirings and for connecting to the source region and form a pixel electrode for connecting to the drain region via the respective contact holes.

As in the case of the TFT substrate when the TFT is inversely staggered or normally staggered as described above, the present invention can be applied to a case when the Cs wiring 12 is not used.

The embodiment described above has described the case in which the gate electrode wiring 11; the compensation capacitance wiring 12 (Cs wiring 12) parallel to the gate electrode wiring 11; and the source electrode wiring 13 in a direction intersecting the gate electrode wiring 11 and the compensation capacitance wiring 12 and cutoff by the formed portion of the gate electrode wiring 11 and the compensation capacitance wiring 12 are formed. However, the present invention is not limited to this. It is possible to form the source electrode wiring 13; the gate electrode wiring 11 in a direction intersecting the source electrode wiring 13 and cutoff by the formed portion of the source electrode wiring 13; and the compensation capacitance wiring 12 parallel to the gate electrode wiring 11 and cutoff by the formed portion of the source electrode wiring 13.

As described above, the present invention is exemplified by the use of its preferred embodiment (s). However, the present invention should not be interpreted solely based on the present embodiment(s). It is understood that the scope of the present invention should be interpreted solely based on the claims. It is also understood that those skilled in the art can implement equivalent scope of technology, based on the description of the present invention and common knowledge from the description of the detailed preferred embodiment(s) of the present invention. Furthermore, it is understood that any patent, any patent application and any references cited in the present specification should be incorporated by reference in the present specification in the same manner as the contents are specifically described therein.

In a field: a display control substrate, such as a thin film transistor (thin film transistor) substrate, in which a TFT or the like is provided as a transistor element, for each of a multiplicity of pixel sections provided in two dimensions, used in an active matrix-type liquid crystal display device and the like, for example; a method for manufacturing the display control substrate; a liquid crystal display panel using the display control substrate; and an electronic information device using the display control substrate in the liquid crystal display panel, such as a television device, a monitoring device, a personal computer (e.g., laptop personal computer), an amusement electronic device and a game device, by simultaneously forming a gate electrode wiring/Cs wiring/a part of a source electrode wiring or a part of the gate electrode wiring/apart of the Cs wiring/the source electrode wiring, the present invention can reduce the number of masks, thus realizing the reduction of the lead time, the increase of the yield and the reduction of the manufacturing cost.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for manufacturing a display control substrate in which a gate of a transistor element is connected to a gate electrode wiring and a source electrode wiring is connected to a pixel electrode via the transistor element, the method comprising:
   a wiring forming step including forming the gate electrode wiring and the source electrode wiring so as to intersect each other while one of the gate electrode wiring and the source electrode wiring is cutoff at cut portions such that the other passes between the cut portions;
   an insulation forming step including forming an interlayer insulation film on a substrate after the wiring forming step and forming contact holes in the interlayer insulation film so as to reach the respective cut portions; and
   at the time of forming the pixel electrode by processing a pixel electrode material deposited on the substrate after the contact hole forming step, forming a connecting portion to connect the cut portions via the respective contact holes;
   wherein the wiring forming step includes forming the gate electrode wiring and a compensation capacitance wiring parallel or substantially parallel to the gate electrode wiring, such that the gate electrode wiring and the compensation capacitance wiring intersect the source electrode wiring, and the pair of the gate electrode wiring and the compensation capacitance wiring or the source electrode wiring is cutoff at cut portions such that the other passes between the cut portions.

2. A method for manufacturing a display control substrate according to claim 1, wherein the transistor element is an inversely staggered thin film transistor element.

3. A method for manufacturing a display control substrate according to claim 1, wherein the transistor element is a normally staggered thin film transistor element.

* * * * *